US010153746B2

(12) United States Patent
Baba

(10) Patent No.: US 10,153,746 B2
(45) Date of Patent: Dec. 11, 2018

(54) WIRING BOARD WITH FILTER CIRCUIT AND ELECTRONIC DEVICE

(71) Applicant: Murata Manufacturing Co., Ltd., Nagaokakyo-shi, Kyoto-fu (JP)

(72) Inventor: Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 21 days.

(21) Appl. No.: 15/709,556

(22) Filed: Sep. 20, 2017

(65) Prior Publication Data
US 2018/0006624 A1  Jan. 4, 2018

Related U.S. Application Data

(63) Continuation of application No. PCT/JP2016/084697, filed on Nov. 24, 2016.

(30) Foreign Application Priority Data

Dec. 2, 2015   (JP) ................. 2015-235441

(51) Int. Cl.
*H03H 7/01* (2006.01)
*H05K 1/02* (2006.01)
(Continued)

(52) U.S. Cl.
CPC ......... *H03H 7/0115* (2013.01); *H05K 1/0224* (2013.01); *H05K 1/0243* (2013.01);
(Continued)

(58) Field of Classification Search
CPC ...... H03H 7/0115; H05K 1/0243; H05K 1/18; H05K 2201/10015; H05K 2201/1003
(Continued)

(56) References Cited

U.S. PATENT DOCUMENTS

2010/0090781 A1   4/2010  Yamamoto et al.
2011/0030997 A1   2/2011  Hsu
(Continued)

FOREIGN PATENT DOCUMENTS

JP           8-8499 A       1/1996
JP      2014/119362 A1     8/2014
(Continued)

OTHER PUBLICATIONS

Official Communication issued in International Patent Application No. PCT/JP2016/084697, dated Feb. 14, 2017.

*Primary Examiner* — Benny Lee
*Assistant Examiner* — Hafizur Rahman
(74) *Attorney, Agent, or Firm* — Keating & Bennett, LLP

(57) ABSTRACT

A wiring board with a filter circuit includes an insulating base, a conductor pattern, and a filter circuit. The conductor pattern is provided on the insulating base and defines the filter circuit. The insulating base includes an intermediate member, and first through third end members connected to the intermediate member. A first external connection terminal is provided on the first end member, and is disposed on a first end of the conductor pattern in the signal transmission direction. A second external connection terminal is provided on the second end member, and is disposed on a second end of the conductor pattern in the signal transmission direction. A first ground connection terminal that grounds the filter circuit is provided on the intermediate member. A second ground connection terminal that grounds the filter circuit is provided on the third end member.

19 Claims, 7 Drawing Sheets

(51) Int. Cl.
  *H05K 1/18* (2006.01)
  *H05K 1/16* (2006.01)
  *H03H 1/00* (2006.01)

(52) U.S. Cl.
  CPC ............ *H05K 1/162* (2013.01); *H05K 1/165* (2013.01); *H05K 1/18* (2013.01); *H03H 2001/0085* (2013.01); *H05K 1/0298* (2013.01); *H05K 2201/1003* (2013.01); *H05K 2201/10015* (2013.01)

(58) Field of Classification Search
  USPC ....................................................... 333/185
  See application file for complete search history.

(56) References Cited

U.S. PATENT DOCUMENTS

| | | | |
|---|---|---|---|
| 2012/0212305 A1* | 8/2012 | Shafer | H03H 7/0153 333/174 |
| 2015/0094009 A1 | 4/2015 | Yosui et al. | |
| 2015/0325900 A1 | 11/2015 | Baba et al. | |

FOREIGN PATENT DOCUMENTS

| | | | | |
|---|---|---|---|---|
| JP | 2015-29319 A | 2/2015 | | |
| JP | WO 2015033704 A1 * | 3/2015 | ............ | H05K 1/162 |
| WO | 2007/040064 A1 | 4/2007 | | |

\* cited by examiner

FIG.2
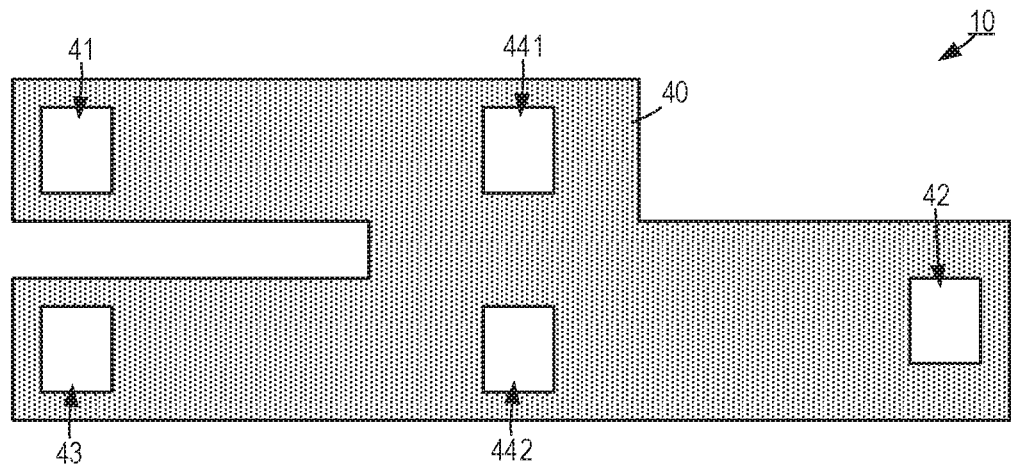
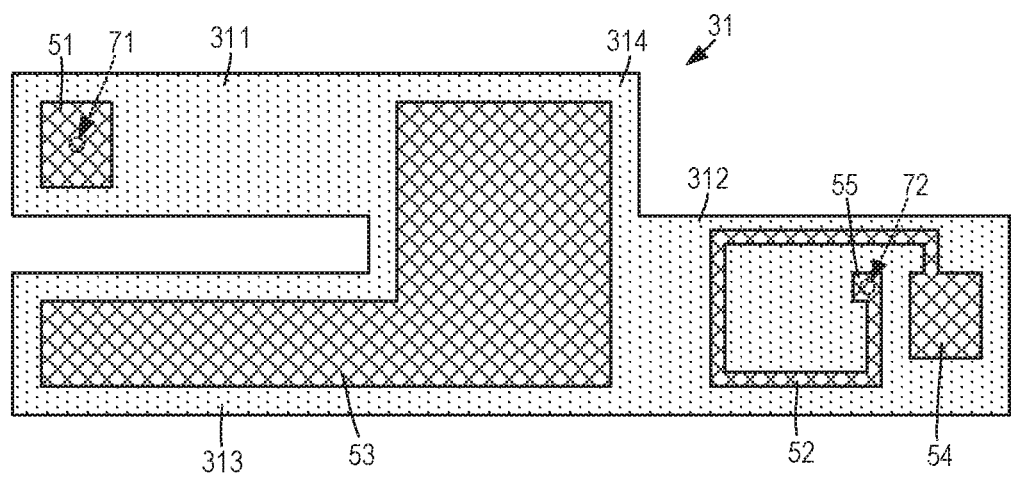
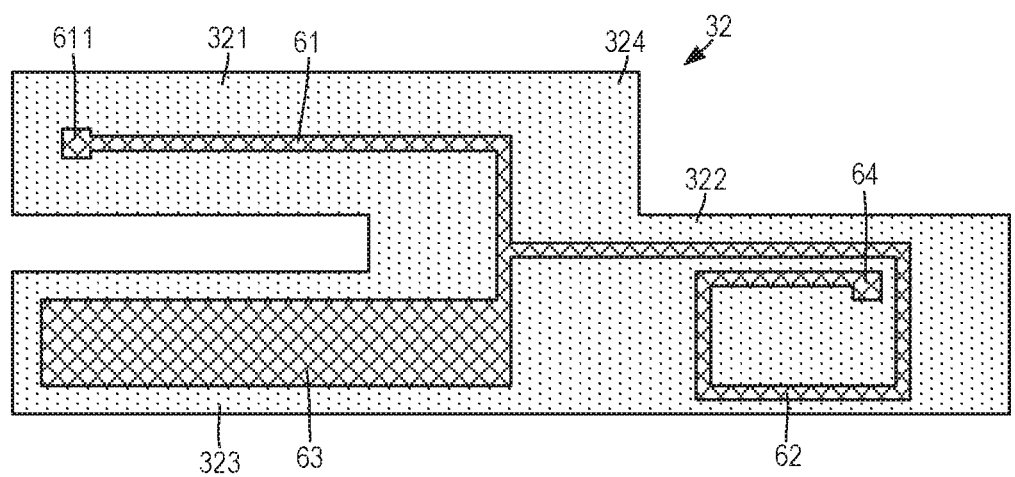

WIRING BOARD WITH FILTER CIRCUIT AND ELECTRONIC DEVICE

CROSS REFERENCE TO RELATED APPLICATIONS

This application claims the benefit of priority to Japanese Patent Application No. 2015-235441 filed on Dec. 2, 2015 and is a Continuation Application of PCT Application No. PCT/JP2016/084697 filed on Nov. 24, 2016. The entire contents of each application are hereby incorporated herein by reference.

BACKGROUND OF THE INVENTION

1. Field of the Invention

The present invention relates to a wiring board with a filter circuit including a plurality of functional members connected thereto and including a filter circuit, and an electronic device that includes the wiring board with a filter circuit and the functional members.

2. Description of the Related Art

A flat cable described in WO2014/119362 is conventionally used in casings of electronic devices, such as mobile terminals for the purpose of connecting to a circuit board or a casing (for example, ground of a metal casing).

The flat cable described in WO2014/119362 includes an elongated dielectric base that is elongated in a signal transmission direction. A connector is mounted on both ends of the dielectric base in an elongated direction for the purpose of connecting to external circuits. The flat cable described in WO2014/119362 provides a filter circuit using a conductor pattern.

A transmission line formed by the flat cable described in WO2014/119362 is grounded only at connectors at both ends of a dielectric base in the elongated direction.

Consequently, the ground potential at a halfway position of the flat cable is unstable, thus affecting characteristics in some cases. In particular, when a filter circuit is provided as in the flat cable described in WO2014/119362, filter characteristics are affected in some cases.

SUMMARY OF THE INVENTION

Preferred embodiments of the present invention provide wiring boards each including a filter circuit that has more stable characteristics.

A wiring board with a filter circuit according to a preferred embodiment of the present invention includes an insulating base that has flexibility and a conductor pattern provided on the insulating base. The wiring board includes a filter circuit defined by the conductor pattern. The insulating base includes an intermediate member, and a first end member, a second end member, and a third end member that are connected to the intermediate member. The first end member and the second end member are disposed along a signal transmission direction with the intermediate member being provided between the first end member and the second end member. A first external connection terminal is provided on the first end member, and the first external connection terminal is disposed on a first end of the conductor pattern of the filter circuit in the signal transmission direction. A second external connection terminal is provided on the second end member, and the second external connection terminal is disposed on a second end of the conductor pattern in the signal transmission direction. A first ground connection terminal that grounds the filter circuit is provided on the intermediate member. A second ground connection terminal that grounds the filter circuit is provided on the third end member.

With this configuration, the wiring board with a filter circuit is grounded at a halfway position between the first external connection terminal and the second external connection terminal in the signal transmission direction. In this case, a substantially central position in the signal transmission direction where the ground tends to be unstable is reliably grounded.

In a wiring board with a filter circuit according to a preferred embodiment of the present invention, a ground conductor pattern defining the first ground connection terminal is preferably provided on an entirety or substantially an entirety of the surface of the intermediate member when viewing the intermediate member in plan view.

Such a configuration increases the area of the ground conductor pattern, and thus, the ground potential is easily stabilized.

A wiring board with a filter circuit according to a preferred embodiment of the present invention is preferably configured as follows. The wiring board with a filter circuit includes an insulating protection member disposed on a surface of the insulating base. The ground conductor pattern is provided on the surface of the insulating base. The ground connection terminal is defined by exposing the ground conductor pattern through a hole provided in the insulating protection member.

Such a configuration enables the ground conductor pattern to be directly connected to an external ground conductor, thus preventing a floating inductance in grounding. Consequently, it is possible to stably ground the filter circuit.

A wiring board with a filter circuit according to a preferred embodiment of the present invention may preferably be configured as follows. The filter circuit includes a capacitor including one end connected to the first ground connection terminal and the second ground connection terminal. The insulating base includes the third end member connected to the intermediate member. The second ground connection terminal is provided on the third end member. The capacitor includes a first planar conductor and a second planar conductor that are provided on the third end member and oppose each other.

With such a configuration, it is possible to achieve a capacitor including one end connected to the ground, which is a so-called shunt-connected capacitor. Additionally, other conductor patterns defining the filter circuit do not overlap the planar conductors defining the capacitor in the configuration. It is thus possible to prevent these conductor patterns and planar conductors from being unnecessarily coupled to each other, and desired filter characteristics are reliably obtained.

A wiring board with a filter circuit according to a preferred embodiment of the present invention may preferably be configured as follows. The filter circuit includes a first inductor connected between the first external connection terminal and the other end of the capacitor and a second inductor connected between the second external connection terminal and the other end of the capacitor. The first planar conductor of the capacitor is connected to a linear conductor pattern defining the first inductor and a linear conductor pattern defining the second inductor. The second planar conductor of the capacitor is a conductor pattern defining the second ground connection terminal.

Such a configuration achieves a T-Type L(inductor)-C (capacitor)-L(inductor) type filter. One of the planar conductors of the capacitor (the second planar conductor) is directly connected to an external ground conductor in the configuration, and thus, desired filter characteristics are obtained and these characteristics are stabilized.

In a wiring board with a filter circuit according to a preferred embodiment of the present invention, a ground conductor pattern defining the first ground connection terminal and a ground conductor pattern defining the second ground connection terminal are preferably defined by an identical or substantially identical second planar conductor.

Such a configuration increases the area of the ground and stabilizes the filter characteristics.

A wiring board with a filter circuit according to a preferred embodiment of the present invention may preferably be configured as follows. The filter circuit includes a first capacitor and a second capacitor that are serially connected to each other between the first external connection terminal and the second external connection terminal. The first capacitor includes a third planar conductor and a fourth planar conductor that are provided on the first end member and oppose each other. The second capacitor includes a fifth planar conductor and a sixth planar conductor that are provided on the second end member and oppose each other.

Such a configuration achieves the first capacitor and the second capacitor that are serially connected to each other between the first external connection terminal and the second external connection terminal. Planar conductors defining the first capacitor and the second capacitor do not overlap the ground conductor. It is thus possible to prevent the first and second capacitors and the ground from being unnecessarily coupled to each other, and desired filter characteristics are reliably achieved.

A wiring board with a filter circuit according to a preferred embodiment of the present invention may preferably be configured as follows. The filter circuit includes an inductor including one end connected between the first capacitor and the second capacitor and another end connected to the first ground connection terminal and the second ground connection terminal. The inductor includes a linear conductor pattern provided on the intermediate member.

Such a configuration achieves a T-type C(capacitor)-L (inductor)-C(capacitor) filter. The configuration prevents coupling of the inductor and the capacitors. Desired filter characteristics are thus reliably obtained.

In a wiring board with a filter circuit according to a preferred embodiment of the present invention, a plurality of the first ground connection terminals is preferably provided.

Such a configuration enables more stable grounding.

In a wiring board with a filter circuit according to a preferred embodiment of the present invention, a portion of the conductor pattern defining the filter circuit is preferably disposed to oppose the ground conductor pattern with an insulator layer defining the insulating base being provided between the portion of the conductor pattern and the ground conductor pattern.

Such a configuration enables the characteristic impedance of a transmission line defined by the conductor pattern to be appropriately set.

An electronic device according to a preferred embodiment of the present invention includes a wiring board with a filter circuit described above, a first circuit board including the first external connection terminal mounted thereon, and a second circuit board including the second external connection terminal mounted thereon.

As a wiring board with a filter circuit described above is included, a desired filtering process is able to be performed on signals transmitted between the first circuit board and the second circuit board. Electrical characteristics desired for the electronic device are thus achieved. Additionally, as the wiring board with a filter circuit is made of an insulating base that has flexibility, the first circuit board is able to be connected via the wiring board with a filter circuit in a bent or twisted state to the second circuit board. Flexibility in the arrangements of the first circuit board and the second circuit board in the electronic device is thus improved. For example, if the first circuit board and the second circuit board are arranged at positions with different heights, the first circuit board is able to be easily connected to the second circuit board. If the wiring board with a filter circuit is bent or twisted, grounding is performed as described above. Consequently, filter characteristics are stabilized and electrical characteristics desired for the electronic device are achieved.

An electronic device according to a preferred embodiment of the present invention may preferably be configured as follows. The electronic device includes the wiring board with a filter circuit described above and a circuit board having at least one of the first external connection terminal and the second external connection terminal mounted thereon and having at least one of the first ground connection terminal and the second ground connection terminal mounted thereon.

As a halfway position of the wiring board with a filter circuit is connected to the ground of a circuit board in such a configuration, the wiring board with a filter circuit is securely connected to the circuit board and stable grounding is achieved.

An electronic device according to a preferred embodiment of the present invention may be configured as follows. The electronic device may include the wiring board with a filter circuit described above and a circuit board having the first ground connection terminal and the second ground connection terminal mounted thereon.

According to such a configuration, both the first ground connection terminal and the second ground connection terminal are connected to the ground of the circuit board, and thus the wiring board with a filter circuit is securely connected to the circuit board and stable grounding is achieved.

According to an electronic device of a preferred embodiment of the present invention, the first external connection terminal, the second external connection terminal, the first ground connection terminal, and the second ground connection terminal may be mounted on a circuit board.

Such a configuration enables a filter circuit disposed on the circuit board to be thin and improves high-frequency characteristics.

Various preferred embodiments of the present invention enable the characteristics of the wiring board to be reliably stabilized.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is an exploded plan view of the wiring board with a filter circuit according to the first preferred embodiment of the present invention.

DETAILED DESCRIPTION OF THE PREFERRED EMBODIMENTS

Figure 1:
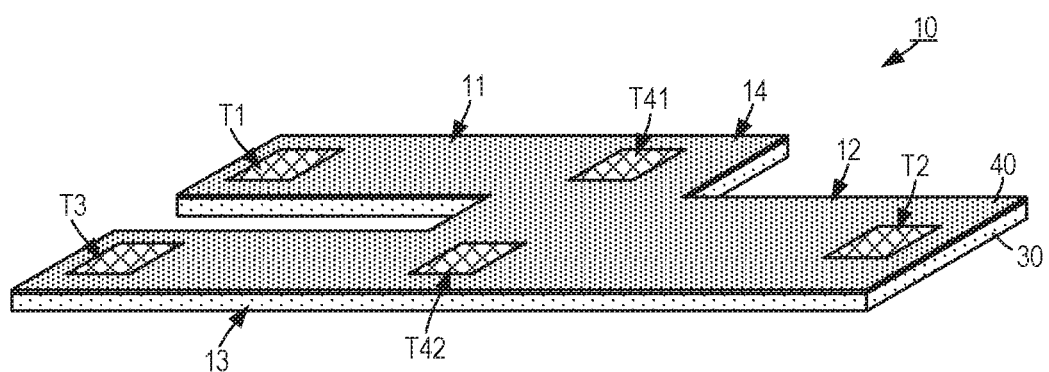
FIG. 1 is a perspective view of a wiring board with a filter circuit according to a first preferred embodiment of the present invention.
Figure 3:
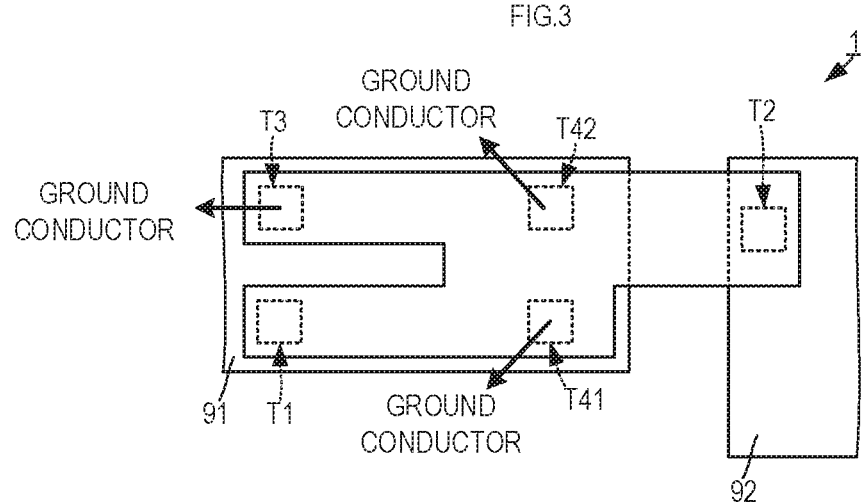
FIG. 3 is a partial structural diagram of an electronic device according to the first preferred embodiment of the present invention.
Figure 4:
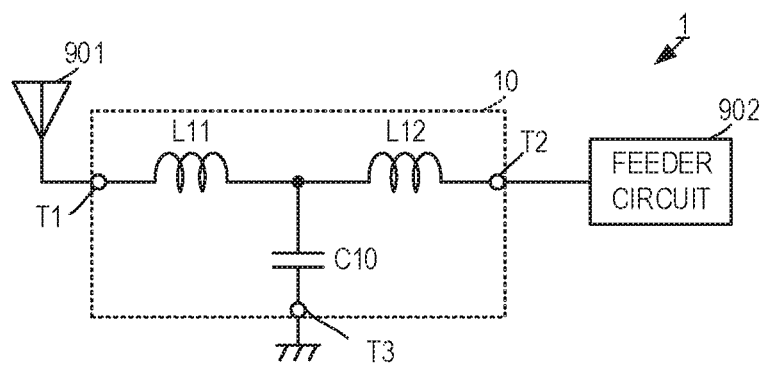
FIG. 4 is a functional block diagram of the electronic device according to the first preferred embodiment of the present invention.

A wiring board with a filter circuit and an electronic device according to a first preferred embodiment of the present invention are described with reference to the drawings. FIG. 1 is a perspective view of the wiring board with a filter circuit according to the first preferred embodiment of the present invention. FIG. 2 is an exploded plan view of the wiring board with a filter circuit according to the first preferred embodiment of the present invention. FIG. 3 is a partial structural diagram of the electronic device according to the first preferred embodiment of the present invention. FIG. 4 is a functional block diagram of the electronic device according to the first preferred embodiment of the present invention.

As shown in FIGS. 1 and 2, a wiring board 10 with a filter circuit includes an insulating base 30 and an insulating protection member 40. The insulating base 30 and the insulating protection member 40 preferably have the same or substantially the same shape in a planar view. The insulating protection member 40 is disposed on a surface of the insulating base 30. For example, the insulating protection member 40 is preferably a cover lay film adhered to the insulating base 30 or as a resist film printed onto the insulating base 30.

As shown in FIG. 2, the insulating base 30 includes an insulator layer 31 and an insulator layer 32. The insulator layer 31 is laminated on the insulator layer 32. The rear surface of the insulator layer 31 contacts the surface of the insulator layer 32. The surface of the insulator layer 31 is also the surface of the insulating base 30. The insulator layers 31 and 32 are preferably made of flexible materials, such as materials containing liquid crystal polymers as the main component, for example.

The insulator layer 31 includes a first end member 311, a second end member 312, a third end member 313, and an intermediate member 314. When viewing the insulator layer 31 in plan view, the first end member 311 and the third end member 313, and the second end member 312 are disposed opposite to each other with the intermediate member 314 being provided therebetween. The first end member 311 and the third end member 313 are disposed with a distance therebetween in a direction perpendicular or substantially perpendicular to the arrangement direction of the first end member 311 and the third end member 313, the intermediate member 314, and the second end member 312.

Conductor patterns 51, 52, 53, 54, and 55 are provided on the surface of the insulator layer 31. Specifically, each conductor pattern is provided as follows.

The conductor pattern 51 is provided on the first end member 311. The conductor pattern 51 is preferably a rectangular or substantially rectangular conductor. The conductor pattern 51 is provided on an end portion of the first end member 311 opposite to an end portion thereof connected to the intermediate member 314.

The conductor patterns 52, 54, and 55 are provided on the second end member 312. The conductor pattern 52 is preferably a wound linear conductor. The conductor pattern 54 is connected to an outer peripheral end of the conductor pattern 52. The conductor pattern 54 is preferably a rectangular or substantially rectangular conductor. A side of the conductor pattern 54 is larger than the width of the conductor pattern 52. The conductor pattern 54 is provided on an end portion of the second end member 312 opposite to an end portion thereof connected to the intermediate member 314. The conductor pattern 55 is connected to an inner peripheral end of the conductor pattern 52. The conductor pattern 55 is preferably a rectangular or substantially rectangular conductor. A side of the conductor pattern 55 is larger than the width of the conductor pattern 52. However, the area of the conductor pattern 55 is less than that of the conductor pattern 54.

The conductor pattern 53 is preferably provided on an entirety or substantially an entirety of the surfaces of the third end member 313 and the intermediate member 314. The conductor pattern 53 corresponds to "ground conductor pattern".

When viewing the insulator layer 31 in plan view, an inter-layer connection conductor 71 is provided at a position on the insulator layer 31 overlapping the conductor pattern 51, and an inter-layer connection conductor 72 is provided at a position on the insulator layer 31 overlapping the conductor pattern 55.

The insulator layer 32 includes a first end member 321, a second end member 322, a third end member 323, and an intermediate member 324. When viewing the insulator layer 32 in plan view, the first end member 321 and the third end member 323 are disposed to be opposite to the second end member 322 with the intermediate member 324 being provided therebetween. The first end member 321 and the third end member 323 are disposed with a distance therebetween in a direction perpendicular or substantially perpendicular to the arrangement direction of the first end member 321 and the third end member 323, the intermediate member 324, and the second end member 322.

Conductor patterns 61, 62, 63, 64, and 611 are provided on the surface of the insulator layer 32. Specifically, each conductor pattern is provided as follows.

The conductor pattern 61 is provided over the first end member 321 and the intermediate member 324. The conductor pattern 61 is preferably a linear conductor connecting an end portion of the first end member 321 connected to the intermediate member 324 to the opposite end portion thereof. The conductor pattern 611 is connected to one end of the conductor pattern 61 (an end portion opposite to an end portion connected to the intermediate member). The conductor pattern 611 is preferably a rectangular or substantially rectangular conductor. A side of the conductor pattern 611 is larger than the width of the conductor pattern 61. When viewing the insulating base 30 in plan view, the conductor pattern 611 overlaps the conductor pattern 51. The conductor pattern 611 is connected via the inter-layer connection conductor 71 to the conductor pattern 51.

The conductor pattern 62 is provided over the second end member 322 and the intermediate member 324. The conductor pattern 62 is preferably a wound linear conductor.

The conductor pattern 64 is provided on the second end member 322. The conductor pattern 64 is connected to an inner peripheral end of the conductor pattern 62. The conductor pattern 64 is preferably a rectangular or substantially rectangular conductor. A side of the conductor pattern 64 is larger than the width of the conductor pattern 62. When viewing the insulating base 30 in plan view, the conductor pattern 64 overlaps the conductor pattern 55. The conductor pattern 64 is connected via the inter-layer connection conductor 72 to the conductor pattern 55. An outer peripheral end of the conductor pattern 62 is connected to the conductor pattern 61 at a position near the other end of the conductor pattern 61 on the intermediate member 324.

The conductor pattern 63 is provided over the third end member 323 and the intermediate member 324. The conductor pattern is preferably a rectangular or substantially rectangular conductor. An end portion of the conductor pattern 63 on a side of the intermediate member 324 is connected to the other end of the conductor pattern 61.

The conductor pattern 53 opposes the conductor pattern 63 with the insulator layer 31 being interposed therebetween. A capacitor (C10 in FIG. 4) that includes opposing conductors respectively provided over the third end member 313 and the intermediate member 314 and over the third end member 323 and the intermediate member 324 is thus provided. The conductor pattern 53 corresponds "second planar conductor" and the conductor pattern 63 corresponds to "first planar conductor".

The conductor pattern 61 is a linear conductor with a predetermined length and defines a first inductor (L11 in FIG. 4). A spiral conductor pattern includes the conductor pattern 52, the inter-layer connection conductor 72, and the conductor pattern 62. The spiral conductor pattern defines a second inductor (L12 in FIG. 4).

A T-type circuit is thus provided in which the first inductor L11 is serially connected to the second inductor L12 and the capacitor is connected to a connection point of the first inductor L11 and the second inductor L12.

Holes 41, 42, 43, 441, and 442 are provided in the insulating protection member 40. Specifically, the respective holes are provided at the following positions.

When viewing the wiring board 10 with a filter circuit in plan view, the hole 41 is provided at a position on the insulating protection member 40 overlapping the conductor pattern 51. The hole 41 causes the conductor pattern 51 to be exposed on the surface of the wiring board 10 with a filter circuit. In this manner, a first external connection terminal T1 shown in FIG. 1 is provided.

When viewing the wiring board 10 with a filter circuit in plan view, the hole 42 is provided at a position on the insulating protection member 40 overlapping the conductor pattern 54. The hole 42 causes the conductor pattern 54 to be exposed on the surface of the wiring board 10 with a filter circuit. In this manner, a second external connection terminal T2 shown in FIG. 1 is provided.

When viewing the wiring board 10 with a filter circuit in plan view, the hole 43 is provided at a position on the insulating protection member 40 near an end portion of the conductor pattern 53 opposite to the intermediate member 314. The hole 43 causes the conductor pattern 53 to be partially exposed on the surface of the wiring board 10 with a filter circuit. In this manner, a third external connection terminal T3 shown in FIG. 1 is provided.

When viewing the wiring board 10 with a filter circuit in plan view, the holes 441 and 442 are provided in the insulating protection member 40 at a region overlapping the conductor pattern 53 on the intermediate member 314. These holes 441 and 442 cause the conductor pattern 53 to be partially exposed on the surface of the wiring board 10 with a filter circuit. In this manner, fourth external connection terminals T41 and T42 shown in FIG. 1 are provided. The third external connection terminal T3 corresponds to "second ground connection terminal", and each of the fourth external connection terminals T41 and T42 corresponds to "first ground connection terminal".

With the configuration of the present preferred embodiment, a circuit is provided in which the first inductor L11 is serially connected to the second inductor L12 between the first external connection terminal T1 and the second external connection terminal T2. Additionally, a circuit is provided in which the capacitor C10 is connected between the connection point of the first inductor L11 and the second inductor L12 and the third external connection terminal T3 and the fourth external connection terminals T41 and T42 that are ground connection terminals. That is, a T-type filter circuit including L11-C10-L12 is provided between the first external connection terminal T1 and the second external connection terminal T2.

With the configuration of the present preferred embodiment, the fourth external connection terminals T41 and T42, which are ground connection terminals, are disposed, along the signal transmission direction, in the area where the capacitor C10 is provided between the first external connection terminal T1 and the second external connection terminal T2. The wiring board 10 with a filter circuit is able to thus be grounded halfway in the signal transmission direction. Consequently, the wiring board 10 with a filter circuit is able to be stably grounded. Therefore, filter characteristics of the wiring board 10 with a filter circuit are stabilized and it is possible to reliably achieve desired filter characteristics.

According to the present preferred embodiment, the conductor pattern 53 defining and functioning as a ground conductor pattern is directly connected to an external ground conductor without using any connectors. It is thus possible to prevent a floating inductor in grounding and to reliably ground the wiring board 10 with a filter circuit.

According to the present preferred embodiment, the conductor pattern 53 defining and functioning as a ground conductor pattern is provided on an entirety of substantially any entirety of the surface of the intermediate member 314 whose area is larger than that of the first end member 311, the second end member 312, and the third end member 313, and two fourth external connection terminals T41 and T42 are provided. Consequently, it is possible to achieve more stable grounding.

According to the present preferred embodiment, portions of the conductor patterns 53 and 63 where the capacitor C10 is provided do not overlap the conductor pattern 61 of the first inductor L11 and the conductor patterns 52 and 62 of the second inductor L12. It is thus possible to prevent the capacitor C10, the first inductor L11, and the second inductor L12 from being unnecessarily coupled to each other. Additionally, the conductor pattern 53 defining and functioning as a ground conductor pattern is disposed between the conductor pattern 61 of the first inductor L11 and the conductor patterns 52 and 62 of the second inductor L12, and thus, it is also possible to prevent the first inductor L11 and the second inductor L12 from being unnecessarily coupled to each other. Consequently, it is possible to reliably obtain the desired filter characteristics.

According to the present preferred embodiment, the first end member on which the first external connection terminal T1 is provided, the second end member on which the second external connection terminal T2 is provided, and the third end member on which the third external connection terminal T3 defining and functioning as a ground connection terminal is provided have a band shape and these end members are connected to the intermediate member, so that the insulating base 30 is provided. It is thus possible to achieve a flexible wiring board 10 with a filter circuit in which the first end member, the second end member, and the third end member are able to be bent or twisted separately, thus enabling various arrangements and configurations. Flexibility in the arrangements of a first circuit board 91 and a second circuit board 92 in an electronic device is thus improved. For example, if the first circuit board 91 and the second circuit board 92 are arranged at positions with different heights, the first circuit board 91 is able to be easily connected to the second circuit board 92. As described above, grounding is performed halfway in the signal transmission direction by the fourth external connection terminals T41 and T42 defining and functioning as ground connection terminals regardless of the shape of the wiring board 10 with a filter circuit, and thus, the wiring board 10 with a filter circuit is stably grounded and filter characteristics are stabilized.

According to the configuration of the present preferred embodiment, the conductor pattern 53 that is the second plane conductor of a capacitor also defines and functions as a ground conductor pattern, and thus, the wiring board 10 with a filter circuit is simplified and made thinner.

According to the configuration of the present preferred embodiment, the conductor patterns 61 and 62 oppose the conductor pattern 53 defining and functioning as a conductor pattern with the insulator layer 31 being interposed therebetween, and thus, it is possible to appropriately set the characteristic impedance of a transmission line defined by the conductor patterns 61 and 62. Consequently, it is possible to achieve the wiring board 10 with a filter circuit with low transmission loss.

As shown in FIG. 3, the wiring board 10 with a filter circuit is used for an electronic device 1. The electronic device 1 includes the wiring board 10 with a filter circuit, the first circuit board 91, and the second circuit board 92. For example, the first circuit board 91 is preferably a circuit board defining and functioning as an antenna 901 shown in FIG. 4. For example, the second circuit board 92 is preferably a circuit board defining and functioning as a feeder circuit 902 shown in FIG. 4.

The first external connection terminal T1 of the wiring board 10 with a filter circuit is joined to a conductor pattern of the first circuit board 91 by a conductive material, such as solder. The second external connection terminal T2 of the wiring board 10 with a filter circuit is joined to a conductor pattern of the second circuit board 92 by a conductive material, such as solder. The third external connection terminal T3 and the fourth external connection terminals T41 and T42 of the wiring board 10 with a filter circuit are joined to the conductor pattern of the first circuit board 91 by a conductive material, such as solder.

It is thus possible to transmit high-frequency signals between the first circuit board 91 and the second circuit board 92 and a filtering process is able to be performed on these high-frequency signals. As filter characteristics of the wiring board with a filter circuit are stable as described above, the electronic device 1 stably achieves excellent electrical characteristics.

For example, as the wiring board 10 with a filter circuit is connected between the antenna 901 and the feeder circuit 902 as shown in FIG. 4, it is possible to provide a filter circuit directly under an antenna with excellent filter characteristics.

Figure 5:
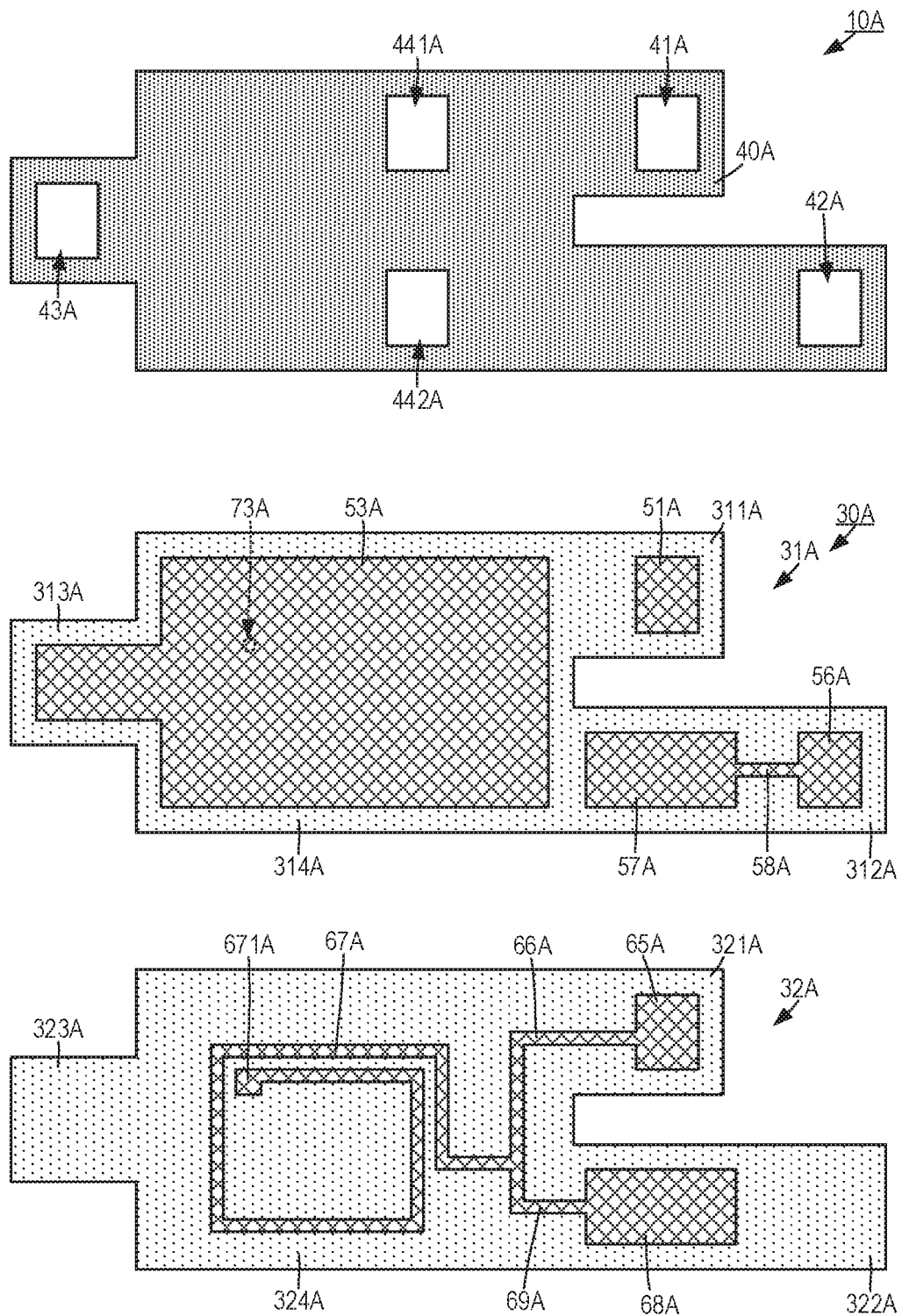
FIG. 5 is an exploded plan view of a wiring board with a filter circuit according to a second preferred embodiment of the present invention.
Figure 6:
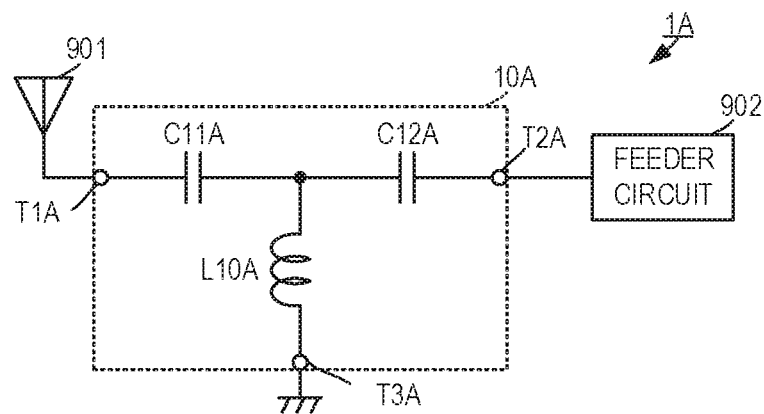
FIG. 6 is a functional block diagram of an electronic device according to the second preferred embodiment of the present invention.

Next, a wiring board with a filter circuit according to a second preferred embodiment of the present invention is described with reference to the drawings. FIG. 5 is an exploded plan view of the wiring board with a filter circuit according to the second preferred embodiment of the present invention. FIG. 6 is a functional block diagram of an electronic device according to the second preferred embodiment of the present invention.

A wiring board 10A with a filter circuit according to the present preferred embodiment includes a circuit configuration in which, as shown in FIG. 6, a first capacitor C11A and a second capacitor C12A are serially connected to each other between a first external connection terminal T1A and a second external connection terminal T2A and an inductor L10A is connected between a connection point of the first capacitor C11A and the second capacitor C12A and a ground potential. That is, the wiring board 10A with a filter circuit is different from the wiring board 10 with a filter circuit according to the first preferred embodiment in the configuration of a filter circuit. The shape of an insulating base 30A and the shape of conductor patterns according to the present preferred embodiment are thus different from the shape of the insulating base 30 and the shape of the conductor patterns according to the first preferred embodiment.

As shown in FIG. 5, the wiring board 10A with a filter circuit includes the insulating base 30A and an insulating protection member 40A. The insulating base 30A and the insulating protection member 40A preferably have the same or substantially the same shape in a plan view. The insulating protection member 40A is disposed on a surface of the insulating base 30A.

As shown in FIG. 5, the insulating base 30A includes an insulator layer 31A and an insulator layer 32A. The insulator layer 31A is laminated on the insulator layer 32A. The rear surface of the insulator layer 31A contacts the surface of the insulator layer 32A. The surface of the insulator layer 31A is also the surface of the insulating base 30A. The insulator layers 31A and 32A are preferably made of flexible materials, such as materials containing liquid crystal polymers as the main component, for example.

The insulator layer 31A includes a first end member 311A, a second end member 312A, a third end member 313A, and an intermediate member 314A. When viewing the insulator layer 31A in plan view, the first end member 311A and the second end member 312A are disposed to be opposite to the third end member 313A with the intermediate member 314A being provided therebetween. The first end member 311A and the second end member 312A are disposed with a distance therebetween in a direction perpendicular to the arrangement direction of the first end member 311A and the second end member 312A, the intermediate member 314A, and the third end member 313A.

Conductor patterns 51A, 53A, 56A, 57A, and 58A are provided on the surface of the insulator layer 31A. Specifically, each conductor pattern is preferably provided as follows.

The conductor pattern 51A is provided on the first end member 311A. The conductor pattern 51A is preferably a rectangular or substantially rectangular conductor. The conductor pattern 51A is provided on an end portion of the first end member 311A opposite to an end portion thereof connected to the intermediate member 314A.

The conductor patterns 56A, 57A, and 58A are provided on the second end member 312A. The conductor patterns 56A and 57A are preferably rectangular or substantially rectangular conductors. The conductor pattern 56A is provided on an end portion of the second end member 312A opposite to an end portion thereof connected to the intermediate member 314A. The conductor pattern 57A is provided on the end portion of the second end member 312A connected to the intermediate member 314A. The conductor pattern 58A is a linear conductor. The conductor pattern 58A is disposed between the conductor pattern 56A and the conductor pattern 57A to connect the conductor pattern 56A to the conductor pattern 57A.

The conductor pattern 53A is provided on an entirety or substantially an entirety of the surfaces of the third end member 313A and the intermediate member 314A. The conductor pattern 53A corresponds to "ground conductor pattern".

When viewing the insulator layer 31A in plan view, an inter-layer connection conductor 73A is provided at a position on the insulator layer 31A overlapping the conductor pattern 53A.

The insulator layer 32A includes a first end member 321A, a second end member 322A, a third end member 323A, and an intermediate member 324A. When viewing the insulator layer 32A in plan view, the first end member 321A and the second end member 322A are disposed to be opposite to the third end member 323A with the intermediate member 324A being provided therebetween. The first end member 321A and the second end member 322A are disposed with a distance therebetween in a direction perpendicular or substantially perpendicular to the arrangement direction of the first end member 321A and the second end member 322A, the intermediate member 324A, and the third end member 323A.

Conductor patterns 65A, 66A, 67A, 68A, 69A, and 671A are provided on the surface of the insulator layer 32A. Specifically, each conductor pattern is preferably provided as follows.

The conductor pattern 65A is provided on the first end member 321A. The conductor pattern 65A is preferably a rectangular or substantially rectangular conductor. The conductor pattern 65A is provided on an end portion of the first end member 321A opposite to an end portion thereof connected to the intermediate member 324A.

The conductor pattern 51A opposes the conductor pattern 65A with the insulator layer 31A being interposed therebetween. The first capacitor C11A shown in FIG. 6 is thus provided. The conductor pattern 51A corresponds to "third planar conductor" and the conductor pattern 65A corresponds to "fourth planar conductor".

The conductor pattern 66A is provided over the first end member 321A and the intermediate member 324A. The conductor pattern 66A is a linear conductor. One end of the conductor pattern 66A is connected to the conductor pattern 65A. The other end of the conductor pattern 66A is connected to the conductor patterns 67A and 69A.

The conductor pattern 67A is provided on the intermediate member 324A. The conductor pattern 67A is preferably a wound linear conductor. An outer peripheral end of the conductor pattern 67A is connected to the conductor patterns 66A and 69A. The conductor pattern 671A is preferably a rectangular or substantially rectangular conductor. A side of the conductor pattern 671A is larger than the width of the conductor pattern 67A. The conductor pattern 671A is connected via the inter-layer connection conductor 73A to the conductor pattern 53A. The inductor L10A shown in FIG. 6 is defined by the conductor pattern 67A.

The conductor pattern 68A is provided on the second end member 322A. The conductor pattern 68A is preferably a rectangular or substantially rectangular conductor. The conductor pattern 68A is provided on an end portion of the second end member 322A connected to the intermediate member 324A.

The conductor pattern 57A opposes the conductor pattern 68A with the insulator layer 31A being interposed therebetween. The second capacitor C12A shown in FIG. 6 is thus provided. The conductor pattern 57A corresponds to "fifth planar conductor" and the conductor pattern 68A corresponds to "sixth planar conductor".

The conductor pattern 69A is provided over the second end member 322A and the intermediate member 324A. The conductor pattern 69A is a linear conductor. One end of the conductor pattern 69A is connected to the conductor pattern 68A. The other end of the conductor pattern 69A is connected to the conductor patterns 66A and 67A.

Holes 41A, 42A, 43A, 441A, and 442A are provided in the insulating protection member 40A. Specifically, the respective holes are preferably provided at the following positions.

When viewing the wiring board 10A with a filter circuit in plan view, the hole 41A is provided at a position on the insulating protection member 40A overlapping the conductor pattern 51A. The hole 41A causes the conductor pattern 51A to be exposed on the surface of the wiring board 10A with a filter circuit. In this manner, a first external connection terminal T1A is provided.

When viewing the wiring board 10A with a filter circuit in plan view, the hole 42A is provided at a position on the insulating protection member 40A overlapping the conductor pattern 56A. The hole 42A causes the conductor pattern 56A to be exposed on the surface of the wiring board 10A with a filter circuit. In this manner, a second external connection terminal T2A is provided.

When viewing the wiring board 10A with a filter circuit in plan view, the hole 43A is provided in the insulating protection member 40A at a region overlapping the conductor pattern 53A on the third end member 313A. The hole 43A causes the conductor pattern 53A on the third end member 313A to be partially exposed on the surface of the wiring board 10A with a filter circuit. In this manner, a third external connection terminal T3A is provided.

When viewing the wiring board 10A with a filter circuit in plan view, the holes 441A and 442A are provided in the insulating protection member 40A at a region overlapping the conductor pattern 53A on the intermediate member 314A. These holes 441A and 442A cause a portion of the conductor pattern 53A on the intermediate member 314A to be partially exposed on the surface of the wiring board 10A with a filter circuit. In this manner, fourth external connection terminals T41A and T42A are provided. The third external connection terminal T3A corresponds to "second ground connection terminal," and each of the fourth external connection terminals T41A and T42A corresponds to "ground connection terminal."

With the configuration of the present preferred embodiment, a circuit is provided in which the first capacitor C11A is serially connected to the second capacitor C12A between the first external connection terminal T1A and the second external connection terminal T2A. Additionally, a circuit is provided in which the inductor L10A is connected between the connection point of the first capacitor C11A and the second capacitor C12A and the third external connection terminal T3A and the fourth external connection terminals T41A and T42A that are ground connection terminals. That is, a T-type filter circuit including C11A-L10A-C12A is provided between the first external connection terminal T1A and the second external connection terminal T2A, as shown in FIG. 6.

With the configuration of the present preferred embodiment, the fourth external connection terminals T41A and T42A, which are ground connection terminals, are disposed, along the signal transmission direction, in the area where the inductor L10A is provided between the first external connection terminal T1A and the second external connection terminal T2A. The wiring board 10A with a filter circuit is thus able to be grounded halfway in the signal transmission direction. Consequently, the wiring board 10A with a filter circuit is able to be stably grounded. Therefore, filter characteristics of the wiring board 10A with a filter circuit are stabilized and it is possible to reliably achieve desired filter characteristics.

The second preferred embodiment achieves similar operations and effects as the first preferred embodiment.

While an integral conductor pattern ("ground conductor pattern") is used for the third external connection terminal and the fourth external connection terminal, which are ground connection terminals, in the preferred embodiments described above, separate conductor patterns may be used for the third external connection terminal and the fourth external connection terminal.

While two fourth external connection terminals are provided in the preferred embodiments described above, any number of the fourth external connection terminals may be provided. That is, it is preferable that at least one fourth external connection terminal is provided, along the signal transmission line, between the first external connection terminal and the second external connection terminal.

While an insulating base includes two insulator layers in the preferred embodiments described above, the number of layers is not limited to two.

While a T-type filter circuit has been described as an example in the preferred embodiments described above, the configuration described above may be applied to, in addition to the T-type filter circuit, a filter circuit that includes a passive element (an inductor or a capacitor) with one end being grounded, and similar operations and effects are obtained.

Figure 7:
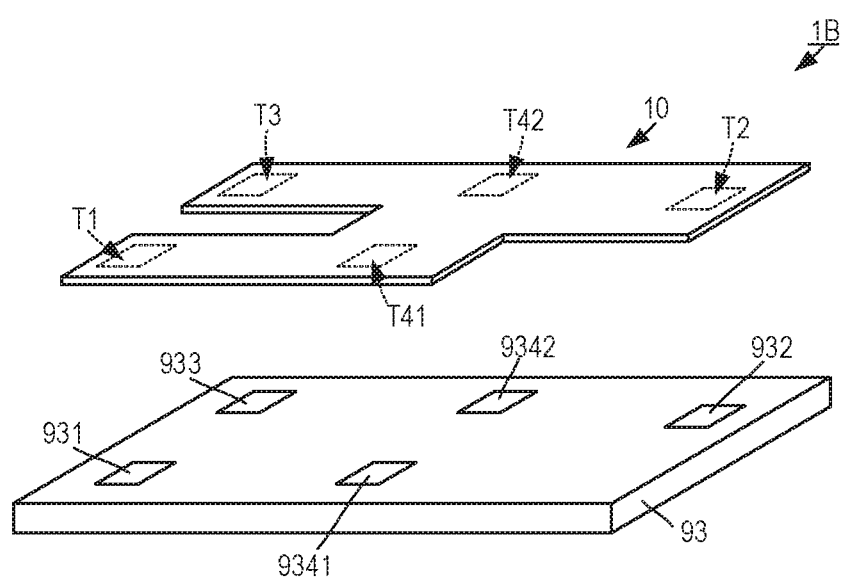
FIG. 7 is an exploded perspective view of an aspect of mounting a wiring board with a filter circuit according to a preferred embodiment of the present invention on a circuit board.

While two circuit boards are connected to each other by a wiring board with a filter circuit in the preferred embodiments described above, a wiring board with a filter circuit may be mounted on a circuit board. FIG. 7 is an exploded perspective view of mounting a wiring board with a filter circuit on a circuit board.

As shown in FIG. 7, an electronic device 1B includes the wiring board 10 with a filter circuit and a circuit board 93. Mounting land conductors 931, 932, 933, 9341, and 9342 are provided on the surface of the circuit board 93.

The wiring board 10 with a filter circuit is mounted on the surface of the circuit board 93. The first external connection terminal T1, the second external connection terminal T2, the third external connection terminal T3, and the fourth external connection terminals T41 and T42 are preferably respectively joined by solder to the mounting land conductors 931, 932, 933, and 9341 and 9342 of the circuit board 93.

According to such a configuration, a thin filter may be disposed on the surface of the circuit board 93, and thus, the electronic device 1B is able to be made thin. As the wiring board 10 with a filter circuit is made of materials with excellent high-frequency characteristics, such as liquid crystal polymers, high-frequency characteristics of a filter circuit are improved as compared to a case of providing a filter circuit in an insulator of the circuit board 93. It is thus possible to provide the electronic device 1B with excellent high-frequency characteristics. If both ends of the circuit board 93 connected to a wiring board with a filter circuit are at positions with different heights, the wiring board with a filter circuit is easily mounted on the circuit board 93 as in the preferred embodiments described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wiring board with a filter circuit comprising:
an insulating base that has flexibility;
a conductor pattern provided on the insulating base; and
a filter circuit defined by the conductor pattern; wherein
the insulating base includes an intermediate member, and a first end member, a second end member, and a third end member that are connected to the intermediate member;
the first end member and the second end member are disposed along a signal transmission direction with the intermediate member being provided between the first end member and the second end member;
a first external connection terminal is provided on the first end member, the first external connection terminal being disposed on a first end of the conductor pattern of the filter circuit in the signal transmission direction;
a second external connection terminal is provided on the second end member, the second external connection terminal being disposed on a second end of the conductor pattern in the signal transmission direction;
a first ground connection terminal that grounds the filter circuit is provided on the intermediate member;
a second ground connection terminal that grounds the filter circuit is provided on the third end member;
a ground conductor pattern defining the first ground connection terminal is provided on an entirety or substantially an entirety of a surface of the intermediate member when viewing the intermediate member in plan view;
an insulating protection member is disposed on a surface of the insulating base;
the ground conductor pattern is provided on the surface of the insulating base; and
the ground conductor pattern is exposed through a hole provided in the insulating protection member.

2. The wiring board with a filter circuit according to claim 1, wherein a plurality of the first ground connection terminals is provided.

3. The wiring board with a filter circuit according to claim 1, wherein the insulating base is made of a material containing liquid crystal polymers as a main component.

4. The wiring board with a filter circuit according to claim 1, wherein
the filter circuit includes a capacitor including one end that is connected to the first ground connection terminal and the second ground connection terminal; and
the capacitor includes a first planar conductor and a second planar conductor that are provided on the third end member and oppose each other.

5. The wiring board with a filter circuit according to claim 4, wherein
the filter circuit includes a first inductor connected between the first external connection terminal and another end of the capacitor and a second inductor connected between the second external connection terminal and the other end of the capacitor;
the first planar conductor is connected to a linear conductor pattern defining the first inductor and a linear conductor pattern defining the second inductor; and
the second planar conductor is a conductor pattern defining the second ground connection terminal.

6. The wiring board with a filter circuit according to claim 5, wherein the second inductor includes a spiral conductor pattern.

7. The wiring board with a filter circuit according to claim 5, wherein the ground conductor pattern defining the first ground connection terminal and the ground conductor pattern defining the second ground connection terminal are provided by an identical second planar conductor.

8. The wiring board with a filter circuit according to claim 5, wherein the linear conductor pattern defining the second inductor is a wound linear conductor.

9. The wiring board with a filter circuit according to claim 1, wherein the filter circuit is a T-type circuit.

10. An electronic device comprising:
the wiring board with a filter circuit according to claim 1; and
a circuit board including at least one of the first external connection terminal and the second external connection terminal mounted thereon and at least one of the first ground connection terminal and the second ground connection terminal mounted thereon.

11. An electronic device comprising:
the wiring board with a filter circuit according to claim 1; and
a circuit board including the first ground connection terminal and the second ground connection terminal mounted thereon.

12. The electronic device according to claim 11, wherein the first external connection terminal and the second external connection terminal are mounted on the circuit board.

13. A wiring board with a filter circuit comprising:
an insulating base that has flexibility;
a conductor pattern provided on the insulating base; and
a filter circuit defined by the conductor pattern; wherein
the insulating base includes an intermediate member, and a first end member, a second end member, and a third end member that are connected to the intermediate member;
the first end member and the second end member are disposed along a signal transmission direction with the intermediate member being provided between the first end member and the second end member;
a first external connection terminal is provided on the first end member, the first external connection terminal being disposed on a first end of the conductor pattern of the filter circuit in the signal transmission direction;
a second external connection terminal is provided on the second end member, the second external connection terminal being disposed on a second end of the conductor pattern in the signal transmission direction;
a first ground connection terminal that grounds the filter circuit is provided on the intermediate member;
a second ground connection terminal that grounds the filter circuit is provided on the third end member;
a ground conductor pattern defining the first ground connection terminal is provided on an entirety or substantially an entirety of a surface of the intermediate member when viewing the intermediate member in plan view;
the filter circuit includes a first capacitor and a second capacitor that are serially connected to each other between the first external connection terminal and the second external connection terminal;
the first capacitor includes a third planar conductor and a fourth planar conductor that are provided on the first end member and oppose each other;
the second capacitor includes a fifth planar conductor and a sixth planar conductor that are provided on the second end member and oppose each other;
the filter circuit includes an inductor including one end that is connected between the first capacitor and the second capacitor and another end that is connected to the first ground connection terminal and the second ground connection terminal; and
the inductor includes a linear conductor pattern provided on the intermediate member.

14. An electronic device comprising:
a wiring board with a filter circuit comprising:
an insulating base that has flexibility;
a conductor pattern provided on the insulating base; and
a filter circuit defined by the conductor pattern; wherein
the insulating base includes an intermediate member, and a first end member, a second end member, and a third end member that are connected to the intermediate member;
the first end member and the second end member are disposed along a signal transmission direction with the intermediate member being provided between the first end member and the second end member;
a first external connection terminal is provided on the first end member, the first external connection terminal being disposed on a first end of the conductor pattern of the filter circuit in the signal transmission direction;
a second external connection terminal is provided on the second end member, the second external connection terminal being disposed on a second end of the conductor pattern in the signal transmission direction;
a first ground connection terminal that grounds the filter circuit is provided on the intermediate member; and
a second ground connection terminal that grounds the filter circuit is provided on the third end member;
a first circuit board including the first external connection terminal mounted thereon; and
a second circuit board including the second external connection terminal mounted thereon.

15. The wiring board with a filter circuit according to claim 14, wherein the filter circuit includes a capacitor including one end that is connected to the first ground connection terminal and the second ground connection terminal; and
the capacitor includes a first planar conductor and a second planar conductor that are provided on the third end member and oppose each other.

16. The wiring board with a filter circuit according to claim 14, wherein the filter circuit includes a capacitor including one end that is connected to the first ground connection terminal and the second ground connection terminal;
the capacitor includes a first planar conductor and a second planar conductor that are provided on the third end member and oppose each other;
the filter circuit includes a first inductor connected between the first external connection terminal and another end of the capacitor and a second inductor connected between the second external connection terminal and the other end of the capacitor;

the first planar conductor is connected to a linear conductor pattern defining the first inductor and a linear conductor pattern defining the second inductor; and the second planar conductor is a conductor pattern defining the second ground connection terminal.

17. A wiring board with a filter circuit comprising:

an insulating base that has flexibility;

a conductor pattern provided on the insulating base; and a filter circuit defined by the conductor pattern; wherein the insulating base includes an intermediate member, and a first end member, a second end member, and a third end member that are connected to the intermediate member;

the first end member and the second end member are disposed along a signal transmission direction with the intermediate member being provided between the first end member and the second end member;

a first external connection terminal is provided on the first end member, the first external connection terminal being disposed on a first end of the conductor pattern of the filter circuit in the signal transmission direction;

a second external connection terminal is provided on the second end member, the second external connection terminal being disposed on a second end of the conductor pattern in the signal transmission direction;

a first ground connection terminal that grounds the filter circuit is provided on the intermediate member;

a second ground connection terminal that grounds the filter circuit is provided on the third end member;

a ground conductor pattern defining the first ground connection terminal is provided on an entirety or substantially an entirety of a surface of the intermediate member when viewing the intermediate member in plan view; and a portion of the conductor pattern defining the filter circuit opposes the ground conductor pattern with an insulator layer defining the insulating base being provided between the portion of the conductor pattern and the ground conductor pattern.

18. The wiring board with a filter circuit according to claim 17, wherein the filter circuit includes a capacitor including one end that is connected to the first ground connection terminal and the second ground connection terminal; and the capacitor includes a first planar conductor and a second planar conductor that are provided on the third end member and oppose each other.

19. The wiring board with a filter circuit according to claim 17, wherein the filter circuit includes a capacitor including one end that is connected to the first ground connection terminal and the second ground connection terminal;

the capacitor includes a first planar conductor and a second planar conductor that are provided on the third end member and oppose each other;

the filter circuit includes a first inductor connected between the first external connection terminal and another end of the capacitor and a second inductor connected between the second external connection terminal and the other end of the capacitor;

the first planar conductor is connected to a linear conductor pattern defining the first inductor and a linear conductor pattern defining the second inductor; and the second planar conductor is a conductor pattern defining the second ground connection terminal.

\* \* \* \* \*